US012222775B2

(12) United States Patent
Henderson et al.

(10) Patent No.: US 12,222,775 B2
(45) Date of Patent: Feb. 11, 2025

(54) INFORMATION HANDLING SYSTEM HOUSING INTERIOR ILLUMINATION

(71) Applicant: Dell Products L.P., Round Rock, TX (US)

(72) Inventors: Gregory L. Henderson, Round Rock, TX (US); Jason T. Minehart, Cedar Park, TX (US); Timothy R. Graham, Round Rock, TX (US)

(73) Assignee: Dell Products L.P., Round Rock, TX (US)

( * ) Notice: Subject to any disclaimer, the term of this patent is extended or adjusted under 35 U.S.C. 154(b) by 725 days.

(21) Appl. No.: 17/411,351

(22) Filed: Aug. 25, 2021

(65) Prior Publication Data

US 2023/0061597 A1 Mar. 2, 2023

(51) Int. Cl.
*G06F 1/18* (2006.01)
*G06F 1/16* (2006.01)
*H05K 5/02* (2006.01)

(52) U.S. Cl.
CPC ........... *G06F 1/181* (2013.01); *H05K 5/0243* (2013.01); *H05K 5/0252* (2013.01); *G06F 1/1601* (2013.01); *G06F 1/1637* (2013.01)

(58) Field of Classification Search
CPC .. H05K 5/0047; H05K 5/0052; H05K 5/0226; H05K 5/0243; H05K 5/0252; G06F 1/181; G06F 1/1601; G06F 1/1637
See application file for complete search history.

(56) References Cited

U.S. PATENT DOCUMENTS

| 6,144,549 | A | * | 11/2000 | Moss | ................... | H05K 7/1494 |
| | | | | | | 345/169 |
| 6,494,593 | B2 | * | 12/2002 | An | ..................... | G02F 1/133308 |
| | | | | | | 362/23.18 |
| 6,993,690 | B1 | * | 1/2006 | Okamoto | ........... | G11C 16/3418 |
| | | | | | | 365/185.33 |

(Continued)

OTHER PUBLICATIONS

U.S. Appl. No. 17/081,266, filed Oct. 27, 2020, entitled "Information Handling System Transparent OLED Display and Method of Control Thereof," by inventors Jace W. Files and John Trevor Morrison, U.S. Appl. No. 17/081,266.

(Continued)

*Primary Examiner* — Nidhi Thaker
(74) *Attorney, Agent, or Firm* — Zagorin Cave LLP; Robert W. Holland

(57) ABSTRACT

An information handling system housing has an opening at one side with a transparent cover through which processing components of the information handling system are visible. A member rotationally couples in the housing interior across the opening in a spaced parallel relationship with an upper side of the opening and includes lights that direct illumination from an interior side of the member towards the processing components. In one embodiment, the member has a logo opening that passes light through to illuminate a logo, or alternatively the logo may have its own illumination to present at the front face. In an alternative embodiment, the member has a display panel that presents visual images, such as operating conditions of the processing components. The member rotates out of the interior and up above the opening upper side to provide end user access to the housing interior.

16 Claims, 5 Drawing Sheets

(56) References Cited

U.S. PATENT DOCUMENTS

| | | | |
|---|---|---|---|
| 7,035,087 B2 | 4/2006 | Tan | |
| 7,299,575 B2* | 11/2007 | Hutchinson | H05K 5/0252 |
| | | | 40/443 |
| 7,452,098 B2* | 11/2008 | Kerr | G06F 1/1601 |
| | | | 362/555 |
| 7,824,078 B2* | 11/2010 | Peng | G06F 1/1616 |
| | | | 362/253 |
| 8,638,549 B2* | 1/2014 | Garelli | G06F 1/181 |
| | | | 361/679.55 |
| 2004/0156192 A1* | 8/2004 | Kerr | H05B 47/175 |
| | | | 362/154 |
| 2006/0274534 A1* | 12/2006 | Chang | G03B 21/145 |
| | | | 362/362 |
| 2008/0266773 A1* | 10/2008 | Szolyga | G06F 1/182 |
| | | | 361/679.6 |
| 2011/0090712 A1* | 4/2011 | Bergeron | B29C 63/02 |
| | | | 156/278 |
| 2017/0138573 A1* | 5/2017 | Spiel | G09F 13/06 |
| 2018/0192791 A1* | 7/2018 | Miller | F25D 23/02 |
| 2019/0258107 A1* | 8/2019 | Fujii | G02F 1/133308 |
| 2023/0229116 A1* | 7/2023 | Yuen | G04G 9/0041 |

OTHER PUBLICATIONS

U.S. Appl. No. 17/119,594, filed Dec. 11, 2020, entitled "Information Handling System Visual Presentation with Audio Vector Based Information," by inventors Travis C. North et al., U.S. Appl. No. 17/119,494.

IBuypower, "iBUYPOWER Snowblind S Case 19" Translucent Customizable Side-Panel LCD Display 1280×1024 Resolution Mid-Tower Desktop Computer Gaming Case—White," downloaded from https://www.newegg.com/p/2AM-00CK-00008 on Aug. 25, 2021, 3 pages.

Champvision, "Gaming Applications," Champ Vision Display Inc. Nov. 2019, downloaded from www.champvision.com.tw Aug. 25, 2021, 19 pages.

* cited by examiner

INFORMATION HANDLING SYSTEM HOUSING INTERIOR ILLUMINATION

BACKGROUND OF THE INVENTION

Field of the Invention

The present invention relates in general to the field of information handling system housings, and more particularly to an information handling system housing interior illumination.

Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Information handling systems integrate processing components in a housing to support processing of information in response to end user inputs for presentation at output devices, such as presentation of visual images at a display and presentation of audio information at speakers. Many desktop configurations of information handling systems are built into utilitarian housings meant to be hidden out of the way and supporting peripheral displays, speakers, keyboards, mouse and other input/output devices through wired and wireless interfaces, such as USB cables or Bluetooth. Desktop housings generally have interiors sized to contain processing components with adequate power and thermal capabilities to operate at the full capacity of the processing components. Increased housing interior size offers greater airflow capacity with reduced airflow impedance so that an internal cooling fan or other cooling device can more readily manage excess thermal energy generated by processing components. For typical enterprise desktop systems, expected processing tasks involve executing email, Web browsing, word processing and similar applications that generate a typical processing load that has the processing components in a relatively small housing. More intense processing demands, such as to perform computer aided design and complex graphics, may be performed with processing components disposed in larger housings. The most intense processing demands are often generated by gaming applications, which often present complex graphics and demand minimal latency. Information handling systems designed to support gaming applications often have the most powerful processors and graphics that are available so that the processing components generally are carefully arranged within the housing to ensure adequate management of thermal constraints.

End users who purchase information handling systems to execute gaming applications tend to seek not just top end performance, but also ready access to the system interior that allows customization of internal components and artfully designed housings that show off the housing interior. For example, gaming desktop information handling systems include features that enhance the appearance of performance, such as clear side covers that expose internal processing components for viewing during system use and lighting within the housing interior to highlight the interior components. These additional features enhance the appearance of the information handling system housing yet can add complexity in making the housing interior accessible and offering a desired illumination pattern within the housing.

SUMMARY OF THE INVENTION

Therefore, a need has arisen for a system and method which enhances information handling system housing interior illumination.

In accordance with the present invention, a system and method are provided which substantially reduce the disadvantages and problems associated with previous methods and systems for illumination of an information handling system housing interior. An illumination member extends across an information handling system housing opening in an interior under a transparent cover to direct illumination at processing components disposed in the housing interior from lights included in the illumination bar. The illumination member appears to float in the housing interior with a spaced parallel relationship to the housing opening upper side and rotates up out of the housing interior to provide access by an end user to the interior of the housing.

More specifically, an information handling system processes information with processing components disposed in a housing, such as a central processing unit (CPU) that executes instructions to process information and a random access memory (RAM) that stores the instructions and information. The housing has an opening at one side to make the processing components visible to an end user through a transparent cover that couples over the opening. An illumination member couples to the housing in the interior and includes lights that provide illumination directed towards the housing interior and at the processing components. The illumination member has a floating appearance at the transparent cover to direct illumination towards the processing components along a viewing axis of an end user looking into the housing at the processing components so that the housing interior has an enhanced and well-illuminated appearance through the transparent cover. The illumination member rotationally couples to the housing in the interior with a hinge on each opposing end so that, when the transparent cover is removed, the illumination member rotates up and out of the housing interior to the housing exterior above the opening upper side. When rotated up in this manner, the interior of the housing is fully accessible for an end user without interference from the illumination member. The illumination member may include a logo, such as a product name or marketing image, or may include a display panel, such as an organic light emitting diode (OLED) display film, to present operating conditions of processing components disposed in the housing.

The present invention provides a number of important technical advantages. One example of an important technical advantage is that an information handling system interior is illuminated substantially from the viewing angle of an end user of the information handling system viewing the interior through a transparent cover so that a more full visual effect is provided. Disposing the illumination source on a member that extends across the inside of the transparent cover provides a floating visual effect for visual images placed at an outer-facing surface of the member such as an illuminated trademark or logo, or images presented at a display panel integrated in the member. In one example embodiment, the member rotationally couples at the housing interior to rotate out of the opening of the housing having the transparent cover when the transparent cover is removed to provide improved end user access to the housing interior.

BRIEF DESCRIPTION OF THE DRAWINGS

The present invention may be better understood, and its numerous objects, features and advantages made apparent to those skilled in the art by referencing the accompanying drawings. The use of the same reference number throughout the several figures designates a like or similar element.

DETAILED DESCRIPTION

An information handling system interior is illuminated from an illumination member that extends across a housing opening having a transparent cover and can include a visual image presented at the illumination member outer face and visible through the transparent cover. For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a personal computer, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, and a video display. The information handling system may also include one or more buses operable to transmit communications between the various hardware components.

Figure 1:
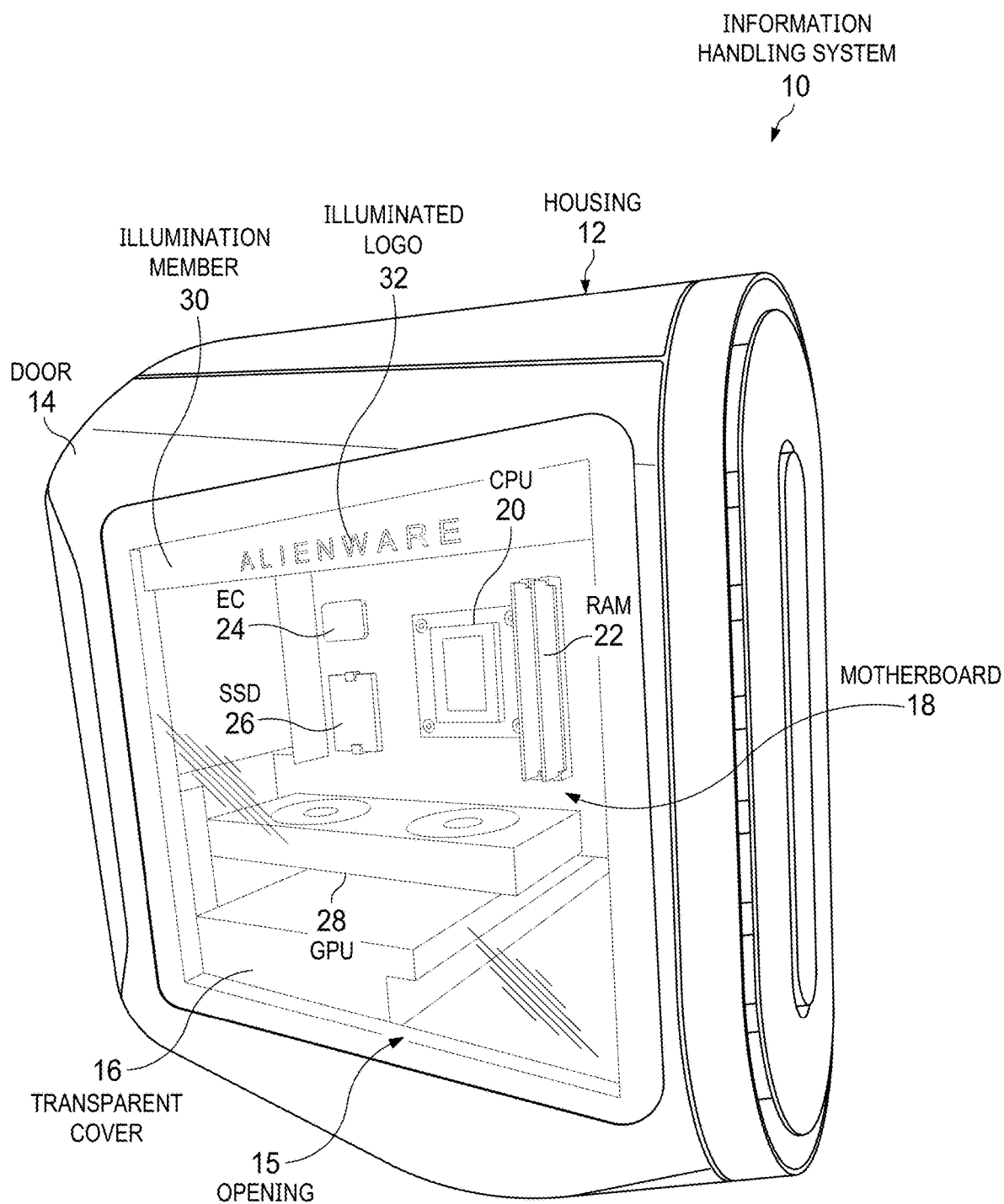
FIG. 1 depicts a side perspective view of an information handling system having an opening with an illumination member visible through a transparent cover.

Referring now to FIG. 1, a side perspective view depicts an information handling system 10 having an opening with an illumination member 30 visible through a transparent cover 16. Information handling system 10 has processing components disposed in housing 12 that cooperate to process information. Housing 12 encloses the processing components with a door 14 that couples to housing 12 and has transparent cover 16 over an opening 15 through which the processing components are visible when enclosed by housing 12. In the example embodiment, the processing components include a motherboard 18 that supports communication between the processing components and a central processing unit (CPU) 20 that executes instructions to process information. CPU 20 interfaces with a random access memory (RAM) 22 that stores the instructions and information, such as an operating system and applications that execute on CPU 20. An embedded controller (EC) 24 executes firmware instructions stored in non-transitory memory to manage operating conditions at information handling system 10, such as application and removal of power, maintaining thermal conditions within thermal constraints and interacting with peripheral input devices like a keyboard and mouse. A solid state drive (SSD) 26 provides persistent storage of information, such as the operating system and applications, during power down periods for retrieval at power up. A graphics processing unit (GPU) 28 further processes the information to generate visual images, such as by defining pixel values for presentation at a display. In alternative embodiments, alternative arrangements of processing components may be used.

In the example embodiment, illumination member 30 couples at the housing interior to extend across the opening of transparent cover 16 with an appearance of floating within transparent cover 16. As is described in greater depth below, illumination member 30 is suspended across the opening of housing 12 in a spaced parallel relationship with the upper side of the opening to provide a floating effect to an end user viewing the information handling system through transparent cover 16. Lights included in illumination member 30 at the rear side are directed towards the processing components to illuminate the processing components along a viewing angle of the end user. That is, illumination member 30 is suspended at a front side of housing 12 relative to transparent cover 16 so that illumination directed from the rear side of illumination member 30 has a similar axis to the viewing angle of an end user so that shadows at the processing components are less apparent to the end user. In the example embodiment, a logo 32 is etched as an opening through illumination member 30 to spell the tradename ALIENWARE, which is illuminated by the lights at the rear side of illumination member so that the tradename appears as a floating illuminated logo at the front of transparent cover 16. As an alternative, logo 32 may have its own separate light source that illuminates the logo at the front face of illumination member 30 so that the logo may illuminate independent of the housing interior illumination. In an alternative embodiment, illumination member 30 may integrate an organic light emitting diode (OLED) display film or liquid crystal display (LCD) panel to present visual images, such as with pixel values defined by GPU 28 or embedded controller 24. For example, operating conditions of the processing components may be presented, such as CPU and/or GPU clock speed, memory capacity used and component temperatures. In one example embodiment, illumination member 30 may have an interchangeable user-facing display that is modularized to allow a user to upgrade or replace the user-facing display after point of sale. For instance, different type of logo, LCD or OLED displays may snap into place and communicate with an embedded controller through a standard type of interface, such as USB or DisplayPort type of cable.

Figure 2:
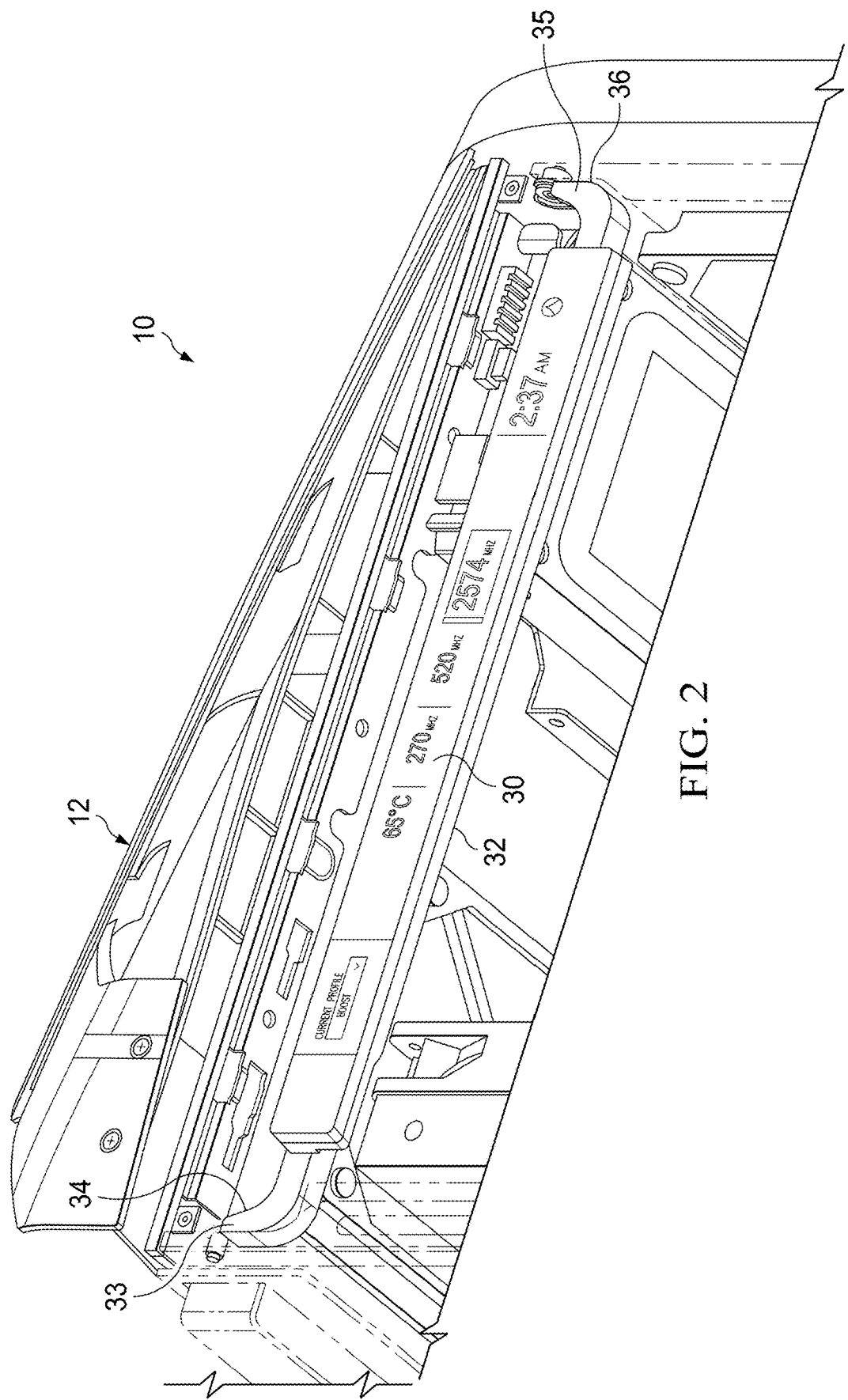
FIG. 2 depicts a side perspective view of the information handling system having the transparent cover removed.

Referring now to FIG. 2, a side perspective view depicts the information handling system having the transparent cover removed. Housing 12 having the door removed exposes illumination member 30 coupled to an interior side of housing 12 with left hinge 34 at a first end 33 and right hinge 36 at a second end 35. A variety of types of hinges may be used, such as those found on notebook information handling systems that have integrated torque engines to manage illumination member 30 position. In the example embodiment, the hinges couple to a housing side surface and suspend illumination member 30 to present operating conditions of the processing components as visual images at a display panel where illuminated logo 32 otherwise appears. For instance, firmware instructions executing on an embedded controller manage the presentation of processing component operating conditions or a logo based upon an end user preference or an operating range. Illumination member 30 is depicted in a spaced parallel relationship with the upper side of the opening of housing 12 and rotated about the hinges to align to a position against the transparent cover for ease of viewing by an end user. In an alternative embodiment, hinges 34 and 36 might extend down from the upper side of the opening. In another alternative embodiment, illumination member 30 may be held suspended with an offset to the opening side and/or aligned in other directions, such as vertical or horizontal directions relative to the opening side surfaces.

Figure 3:
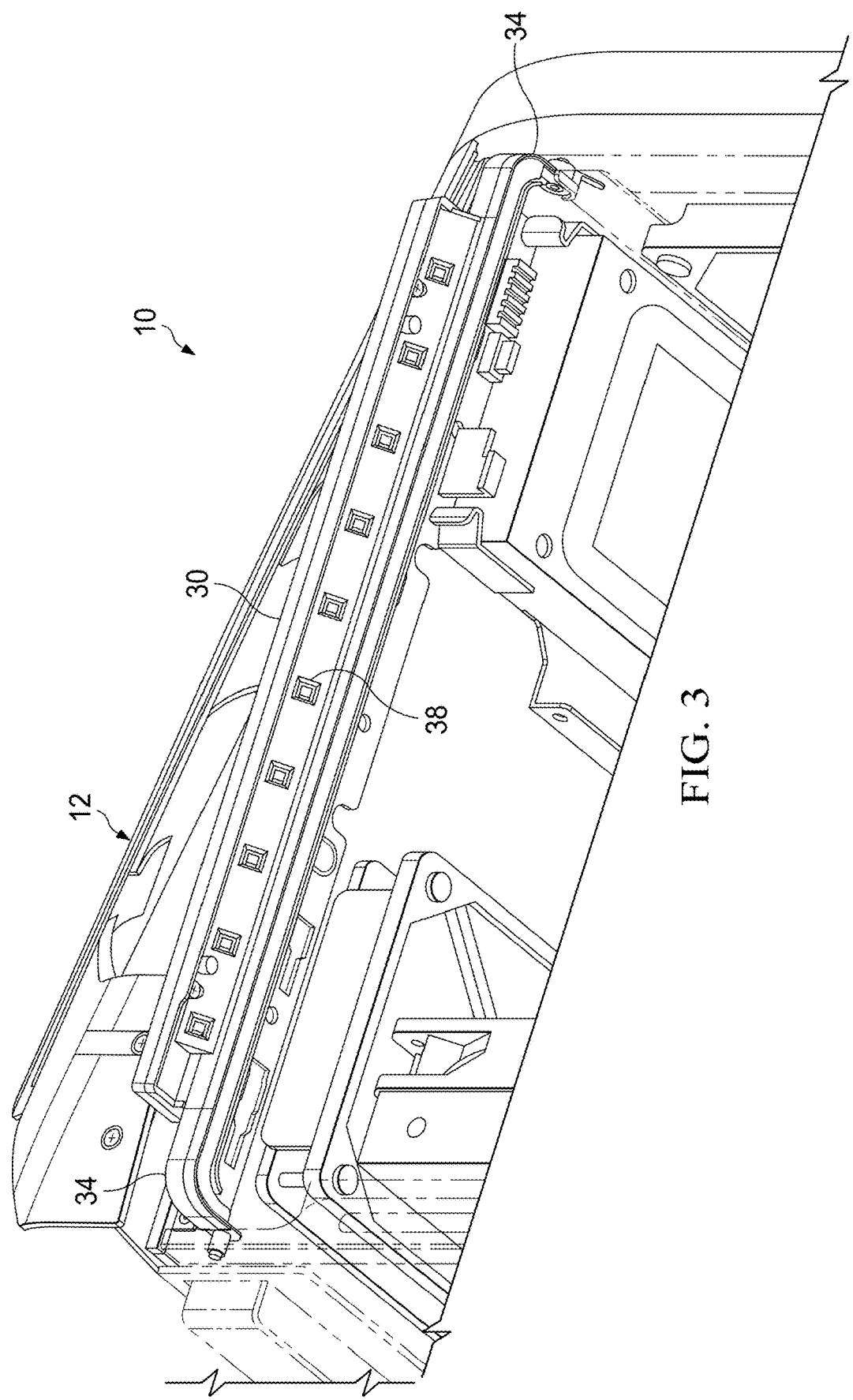
FIG. 3 depicts a side perspective view of the information handling system having the illumination member rotated to an exterior raised position.

Referring now to FIG. 3, a side perspective view depicts the information handling system having the illumination member 30 rotated to an exterior raised position. Illumination member 30 rotates approximately 90 degrees about hinges 34 to raise illumination member above the upper side of the opening of housing 12 and move illumination member 30 to the exterior or housing 12 in the raised position. LED lights 38 are coupled to illumination member 30 and aligned so that illumination from the LED lights will be directed at the processing components when illumination member 30 rotates to the interior position. In the raised exterior position, illumination member 30 is lifted out of the way of access to the housing interior so that an end user can work on the processing components in the interior without interference from illumination member 30. In alternative embodiments, other orientations of illumination member 30 may be available so that, for instance, rotation about hinges 34 move illumination member out of the way off to a side of the housing instead of above the opening as depicted.

Figure 4:
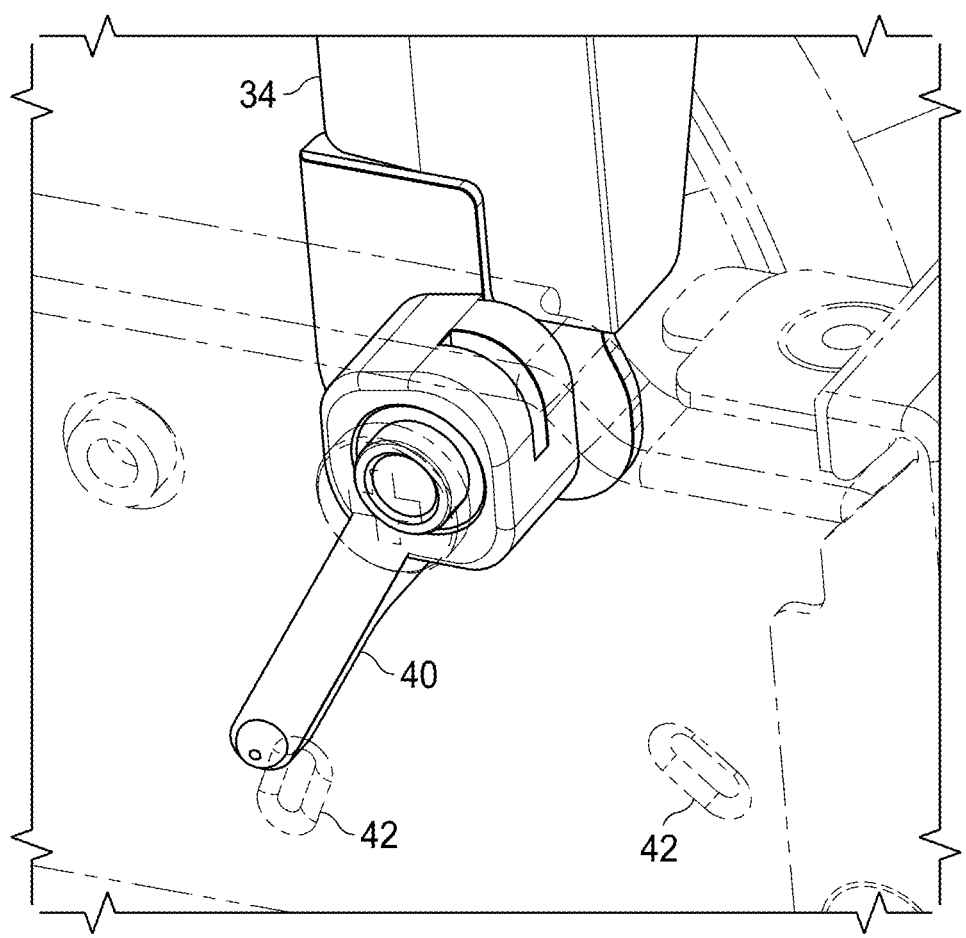
FIG. 4 depicts a side perspective view of an illumination member hinge and position detent.

Referring now to FIG. 4, a side perspective view depicts an illumination member 30 hinge 34 and position detents 42. In the example embodiment, a bushing 40 extends out from hinge 34 to engage against detents 42 formed in the housing side surface. Detents 42 are small openings that an extension at the end of bushing 40 enters to bias hinge 40 to maintain a desired position. For instance, one detent 42 is associated with an interior position of illumination member 30 and the other detent 42 is associated with a raised exterior position of illumination member 30. In one example embodiment, a bushing 40 is coupled to each hinge on each opposing end of illumination member 30, although a single bushing and detent arrangement may be used. In an alternative embodiment, multiple positions of illumination member 30 may be available to adjust how illumination is directed from lights included on the rear face of illumination member 30. In alternative embodiments, detents 42 may be embossed features, projecting either inward or outward, or other types of coupling devices that hold the bushing in place.

Figure 5A:
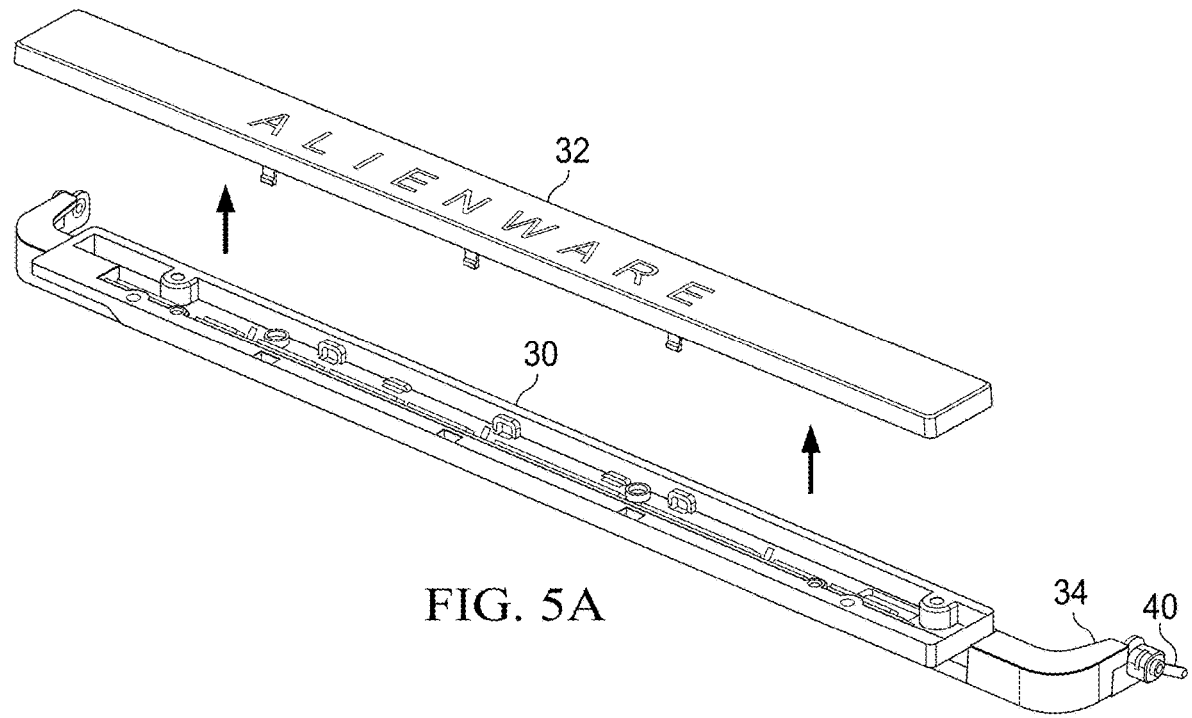
FIGS. 5A and 5B depict exploded perspective views of alternative embodiments for presenting visual images from the illumination member.
Figure 5B:
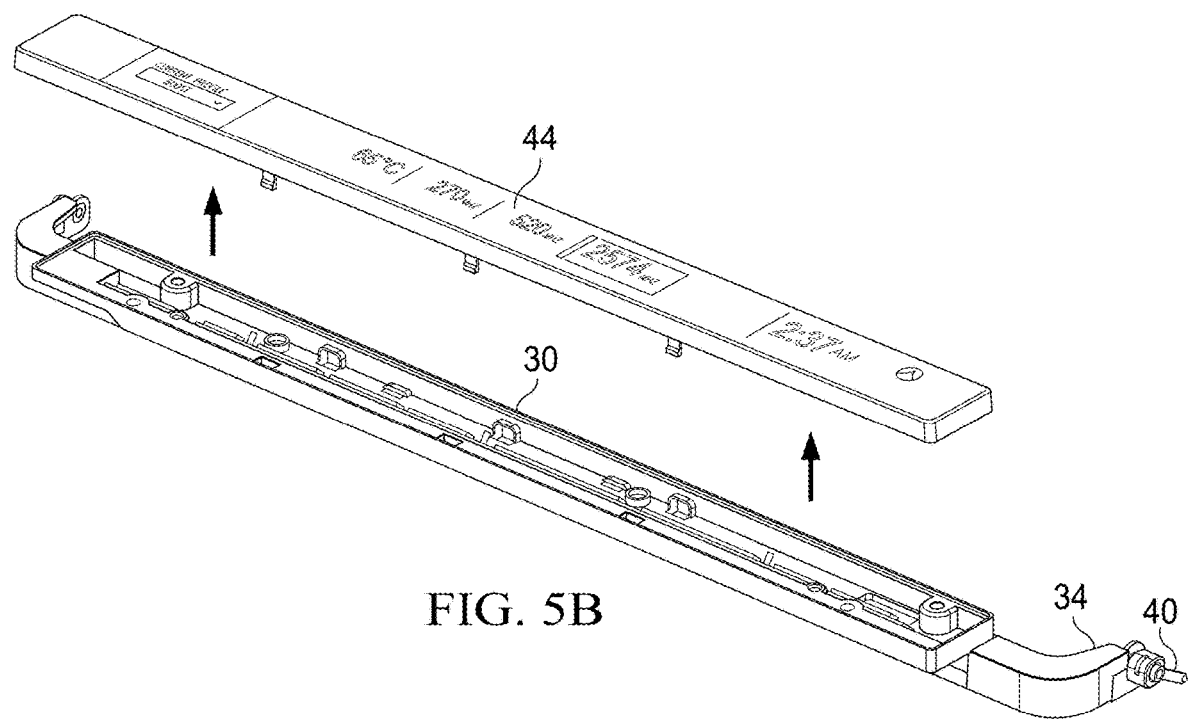

Referring now to FIGS. 5A and 5B, an exploded perspective view depicts alternative embodiments for presenting visual images from the illumination member 30. FIG. 5A depicts an exploded view of illumination member 30 having an illuminated logo 32 coupled to a front face over LED lights included in illumination member 30 that pass light through the logo. In the example embodiment, the logo is presented by having an opening to pass illumination to the front face of illumination member 30. In various embodiments, the quality and brightness of the illumination may be adapted with intermediary light filters. Alternatively, lights designed specifically to illuminate the logo may be included within illumination member 30. FIG. 5B depicts an exploded view of illumination member 30 having an LCD or OLED display panel 44 coupled to the front face to present operating conditions of the information handling system. For instance, the display panel receives and presents CPU, GPU, memory and other operating conditions that are tracked by the embedded controller of the information handling system and indicative of processing performance. Such performance information is often of interest to end users who run gaming applications. In one embodiment, during times when processing performance is of reduced interest, such as when no applications are executing, the display panel may instead present a logo.

Although the present invention has been described in detail, it should be understood that various changes, substitutions and alterations can be made hereto without departing from the spirit and scope of the invention as defined by the appended claims.

What is claimed is:

1. An information handling system comprising: a housing having an interior and an opening; a transparent cover coupled over the opening; processing components disposed in the housing, the processing components including at least a processor operable to execute instructions to process information and a memory interfaced with the processor and operable to store the instructions and information; a member extending across the opening in the interior having a front side visible through the transparent cover and a rear side directed towards the interior; lights coupled to the member rear side and directed towards the interior to provide illumination at the processing components; a first hinge element rotationally coupling a first end of the member to the housing; and a second hinge element rotationally coupling a second end of the member to the housing; wherein the first and second hinge elements rotate the member from the interior and out of the housing opening to the exterior with the transparent cover removed from the opening.

2. The information handling system of claim 1 wherein the member has a logo formed with an opening to pass through the illumination from the lights to show the logo.

3. The information handling system of claim 2 further comprising a display panel integrated in the member and interfaced with the processing components to present the information as visual images.

4. The information handling system of claim 3 wherein the display panel is an organic light emitting diode display.

5. The information handling system of claim 3 wherein the information presented at the display panel comprises operating conditions of the processing components.

6. The information handling system of claim 1 further comprising: a first bushing extending from the first hinge; and first and second detents disposed in the housing and aligned to engage the bushing a first position having the member in the interior and a second position having the member at the exterior.

7. The information handling system of claim 6 wherein the first position suspends the member in the interior in a parallel spaced relationship with one side of the opening.

8. The information handling system of claim 7 wherein the second position suspends the member at the exterior raised above the one side of the opening.

9. A method for illuminating an information handling system housing interior, the method comprising: coupling a member to a housing, the member extending across an opening of the housing; coupling lights to the member at an interior side of the member, the lights directing illumination at processing components disposed in the housing interior; coupling a transparent cover across the opening, the member and processing components visible through the transparent cover; coupling the member in a spaced parallel relationship with an upper side of the opening; coupling each of opposing ends of the member to the housing with a hinge; and rotating the member from the interior to the exterior above the upper side of the opening.

10. The method of claim 9 further comprising:
forming a logo in the member; and
illuminating the logo through the member with the lights.

11. The method of claim 9 further comprising:
coupling a display panel to the member exterior side; and
presenting operating conditions of the processing components at the display panel.

12. The method of claim 9 further comprising:
engaging the hinge with a first detent to hold the member in place in the housing interior; and
engaging the hinge with a second detent to hold the member in place at the housing exterior.

13. The method of claim 9 further comprising adjusting an orientation of the member to direct illumination at a desired portion of the housing interior.

14. A system to illuminate an information handling system housing interior, the system comprising: a housing having an opening; a transparent cover removably coupled to the opening; a member extending across the opening in an interior of the housing with a spaced parallel relationship to an upper side of the opening; lights coupled to the member and directed towards the interior of the housing; a first hinge rotationally coupling a first end of the member to the housing; and a second hinge rotationally coupling a second end of the member to the housing; wherein the member rotates about the hinge to a position at an exterior of the housing above the upper side.

15. The system of claim 14 having a logo formed as an opening through the member to have illumination of the lights visible through the logo.

16. The system of claim 14 having a display panel coupled to the member exterior face and configured to present operating conditions of processing components disposed in the housing.

* * * * *